US005493719A

United States Patent [19]
Smith et al.

[11] Patent Number: 5,493,719
[45] Date of Patent: Feb. 20, 1996

[54] INTEGRATED SUPERCONDUCTIVE HETERODYNE RECEIVER

[75] Inventors: Andrew D. Smith, Redondo Beach; Arnold H. Silver, Rancho Palos Verdes, both of Calif.

[73] Assignee: The United States of America as represented by the Secretary of the Air Force, Washington, D.C.

[21] Appl. No.: 269,711

[22] Filed: Jul. 1, 1994

[51] Int. Cl.⁶ ............................... H04B 1/26; H04B 1/28
[52] U.S. Cl. ........................ 455/325; 455/319; 455/333; 505/202; 505/204; 505/210
[58] Field of Search .................................. 455/323, 325, 455/327, 333, 326, 319, 505; 343/795, 753; 333/117, 99 S; 505/200, 201, 202, 203, 204, 210

[56] References Cited

U.S. PATENT DOCUMENTS

| | | | |
|---|---|---|---|
| Re. 32,369 | 3/1987 | Stockton et al. | 342/368 |
| 3,694,753 | 9/1972 | Arndt | 323/373 |
| 3,737,686 | 6/1973 | Swanekamp et al. | 235/194 |
| 4,070,639 | 1/1978 | Nemit et al. | 333/31 A |
| 4,490,721 | 12/1984 | Stockton et al. | 343/368 |
| 4,607,394 | 8/1986 | Nightingale | 455/327 |
| 4,617,528 | 10/1986 | Bert et al. | 331/56 |
| 4,731,614 | 3/1988 | Crane | 342/372 |
| 4,755,820 | 7/1988 | Backhouse et al. | 343/700 MS |
| 4,823,136 | 4/1989 | Nathanson et al. | 342/368 |
| 4,839,712 | 6/1989 | Mamodaly et al. | 357/51 |
| 4,904,831 | 2/1990 | Nathanson et al. | 200/269 |
| 4,967,201 | 10/1990 | Rich, III | 342/175 |
| 4,977,407 | 12/1990 | Crane | 543/753 |
| 5,119,035 | 6/1992 | Gay et al. | 324/639 |
| 5,166,697 | 11/1992 | Viladevall et al. | 343/727 |

Primary Examiner—Reinhard J. Eisenzopf
Assistant Examiner—Lee Nguyen
Attorney, Agent, or Firm—William G. Auton

[57] ABSTRACT

A high frequency receiver detects and downconverts 50–1,000 GHz radio frequency signals using a receiver consisting of a lens and planar antenna, pre-amplifier, mixer, local oscillator, and IF-amplifier. The insulating dielectric lens is used to focus terahertz radio frequency signals onto the thin film antenna. The preamplifier amplifies these faint signals so that they can be downconverted into an intermediate frequency by the mixer and local oscillator. The mixer is a dual port device which provides isolation of the local oscillator and input signal to avoid saturation of the preamplifier. The IF amplifier boosts the amplitude of the downconverted IF signal produced by the mixer.

5 Claims, 4 Drawing Sheets

INTEGRATED SQUID PARAMETRIC AMPLIFIER

INTEGRATED SUPERCONDUCTIVE HETERODYNE RECEIVER

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to superconductor circuits, and more specifically the invention pertains to a superconductor receiver that includes a lens and planar antenna, pre-amplifier, mixer, local oscillator, and IF amplifier on a single silicon chip.

Surveillance and communication at terahertz frequencies requires advanced technologies to achieve high sensitivities necessary for system performance. Ultimately heterodyne receivers in space will be called upon to approach the fundamental physical limits imposed by the cosmic blackbody radiation and quantum photon noise.

High frequency receivers (greater than 45 GHz) are important for wideband communications, radar, and other remote sensing applications. Current receivers are bulky, insensitive, power-hungry, not monolithic, and incompatible with focal plane arrays.

The spectral region from 50–1000 GHz has applications for passive and active surveillance, and secure, widebanked space communications. Previous exploitation of this band has been nearly impossible because of a lack of device technology. Superconductive electronics based on Josephson junctions incorporated into monolithic or hybrid integrated circuits can provide an entire set of electronic devices and components which will operate from microwave to terahertz frequencies. The fundamental nonlinear properties of the Josephson junction permit development of voltage-controlled oscillators, low noise amplifiers, and coherent detectors over the terahertz frequency band. Ultra low loss exhibited by superconductive transmission lines can be integrated with active superconductive components to achieve efficient, high performance, terahertz circuits.

The task of providing a superconductive, high frequency receiver is alleviated, to some extent, by the systems disclosed in the following U.S. Patents, the disclosures of which are incorporated herein by reference:

U.S. Pat. No. Re 32,639 issued to Stockton et al;
U.S. Pat. No. 4,070,639 issued to Nemit et al;
U.S. Pat. No. 4,490,721 issued to Stockton, et al;
U.S. Pat. No. 4,617,528 issued to Bert et al;
U.S. Pat. No. 4,731,614 issued to Crane;
U.S. Pat. No. 4,823,136 issued to Nathanson et al;
U.S. Pat. No. 4,839,712 issued to Mamodaly et al;
U.S. Pat. No. 4,904,831 issued to Nathanson et al; and
U.S. Pat. No. 4,967,201 issued to Rich, III.

Stockton et al (U.S. Pat. No. Re 32,369 and U.S. Pat. No. 4,490,721) disclose a monolithic microwave integrated circuit including an integrated array antenna. The system includes radiating elements, feed network, phasing network, active and/or passive semiconductor devices, digital logic interface circuits, and a microcomputer controller simultaneously incorporated on a single semi-insulating GaAs substrate by means of a controlled fabricating process sequence. Several embodiments are disclosed (although we note that a heat sink is not disclosed).

Crane discloses a phased array system having a circulator, a transmitter connected to the circulator, a receiver connected to the circulator, a receiver/transmitter IF distribution network connected to the circulator, M phase shifters connected to the receiver/transmitter IF distribution network, a local oscillator, a local oscillator distribution network, N phase shifters, and an orthogonal array of M×N transmitting/receiving means. Each of the receiving means comprises an IF mixing diode connected to one of the M-phase shifters and N-phase shifters. M×N antennas are individually connected to the mixing diodes. The phased array system has plural dielectric layers. A heterodyne or mixing process preserves the phase.

The two Nathanson et al references disclose a transmit-receive means for a phased-array active antenna system using redundancy. Each transmit-receive cell comprises a multiplicity of electronic devices implanted on a common semiconductor substrate. Each transmit-receive means or duplexer comprises an attenuation means, a phase-shifting means, a multistage amplification means, a low-noise amplification means, and appropriate transmit-receive switches. Heat sinks are provided.

Rich, III discloses a multi-layer single substrate microwave transmit/receive module wherein the substrate has at least two opposing mounting surfaces and a plurality of integrated dielectric layers mounting a microwave signal processing means, a control signal processing means, a power conditioning means, and a heat sink interface.

While the above-cited references are instructive, there remains a need to provide a superconductive receiver that receives, down converts, and processes high frequency (50–1,000 GHz) radio frequency signals. The present invention is intended to satisfy that need.

SUMMARY OF THE INVENTION

The present invention includes an entire receiver consisting of a lens and planar antenna, preamplifier, mixer, local oscillator, and IF-amplifier, integrated on a single substrate. The invention performs this function by using thin-film superconductive circuitry incorporating Josephson tunnel junctions as the amplifier, with oscillator, and mixer, with a silicon lens and antenna (such as a thin film bowtie antenna).

The silicon lens is used to focus terahertz radio frequency signals onto the thin film antenna. The preamplifier amplifies these faint signals so that they can be downconverted to an intermediate frequency by the mixer and local oscillator. The mixer is a dual port device which isolates the preamplifier from the mixer local oscillator so that the local oscillator doesn't saturate the preamplifier. The IF amplifier boosts the amplitude of the downconverted IF signal produced by the mixer.

It is an object of the invention to provide a superconductive receiver capable of detecting terahertz radio frequency signals.

It is another object of the invention to receive and downconvert terahertz signals without contaminating them with additional noise or local oscillator signals. These together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

Figure 1:
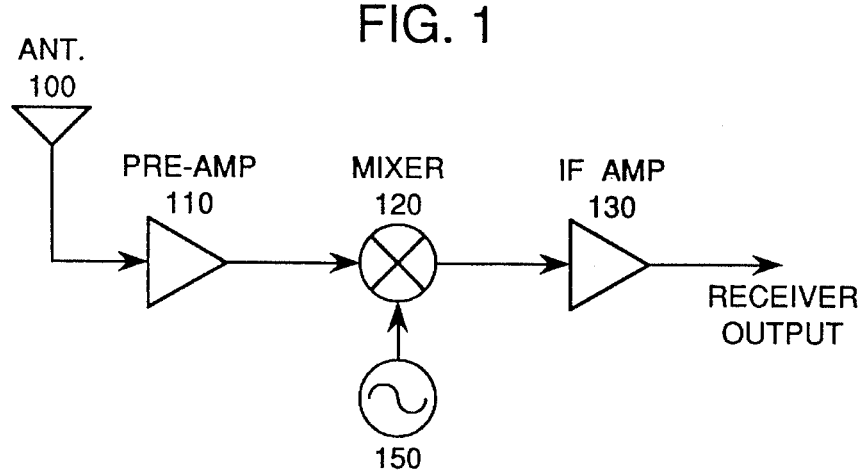
FIG. 1 is a block diagram of the heterodyne receiver of the present invention.

The present invention includes a monolithic low noise superconductive heterodyne receiver at 0.1 THz (for 50–1,000 GHz) including integrable antenna, detector, amplifiers, and oscillators. The reader's attention is now directed towards FIG. 1, which is a THz receiver block diagram containing: an integrated antenna 100, a Josephson preamplifier 110, an SIS mixer 120, a Josephson local oscillator 150, and a Josephson intermediate frequency (IF) amplifier 130. The antenna 100 receives radio frequency (RF) signals in the spectral region for 50–1000 GHZ, and conducts them to the preamplifier 110. The preamplifier 110 amplifies the relatively faint RF signals to reduce noise in the mixing process. The local oscillator 150 outputs a local oscillator signal.

The mixer 120 of FIG. 1 designates a frequency down conversion circuit which receives and downconverts the amplified RF signal from the preamplifier 110 by mixing it with the local oscillator signal from the local oscillator and produces thereby an intermediate frequency (IF) signal of 10 GHz for the IF amplifier 130. The intermediate frequency signal can range between 1 MHz to as high as 30 GHz.

Conventional heterodyne receivers are available up to 100 GHz (0.1 THz) with best noise temperatures between 1000 and 2000 kelvin, corresponding to a noise figure range of 6 to 9 dB. The quantum noise limit varies from 5 to 50 kelvin over the 0.1 to 1 THz frequency range, corresponding to a noise figure of 0.07 to 0.7 dB. THz superconductive amplifiers and detectors are, in principle, capable of approaching this quantum limit. Coupling losses in the antenna and input circuitry will increase the noise temperature directly proportional to the loss. Dissipative or resistive components in the antenna and input circuitry also add noise power in direct proportion to their attenuation. Fundamental limitations on superconductive device performance arise from the Josephson current density, dimension and lithography, device and circuit impedance, and the superconductive energy gap of the device materials. A properly conceived receiver architecture will scale over the THz frequency band. The specific objective of this invention is a monolithic superconductive heterodyne receiver at 0.1 THz with a noise temperature within an order of magnitude of the quantum limit, and to demonstrate a monolithic low noise superconductive coherent receiver which can serve as a prototype for the entire terahertz frequency range. The essential components of our monolithic heterodyne receiver are an antenna, preamplifier, heterodyne detector consisting of the mixer and local oscillator, and an IF or baseband amplifier as shown in FIG. 1.

Figure 2:
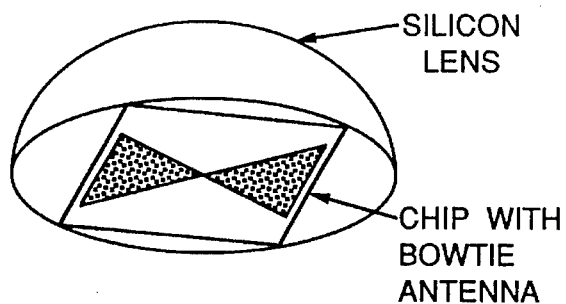
FIGS. 2–6 are views of thin film antenna elements that can be used with the system of FIG. 1.

All of the elements of the system of FIG. 1 will be discussed in detail below in the order that they are used to receive incoming signals. FIGS. 2–6 are views of the thin film antenna element 100 depicted in FIG. 1. In FIG. 2, the thin film antenna is depicted with the optional silicon lens covering it. The silicon lens serves to protect the antenna element, and to focus incoming signals onto the antenna element.

While waveguide components are readily available for 100 GHz operation, scaling to the higher terahertz frequency ranges requires approaches more similar to optical techniques. The planar antenna used to acquire the signal input on the terahertz receiver is a prime example of quasi optical components suitable for the higher frequency range. Other quasi optical components can include dielectric lenses, a quasioptical dewar, along with mirror and window elements.

Figure 3:
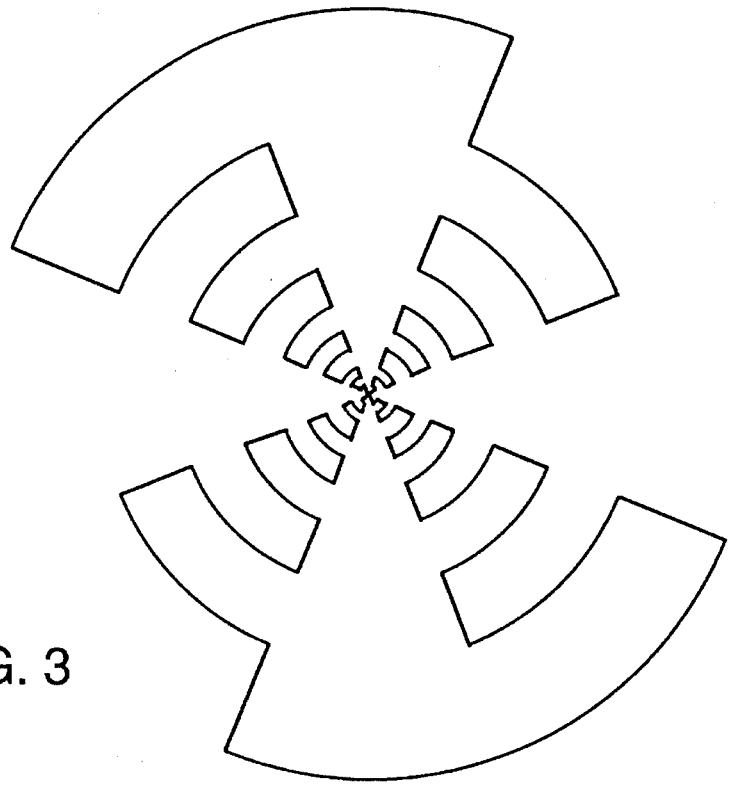
Figure 4:
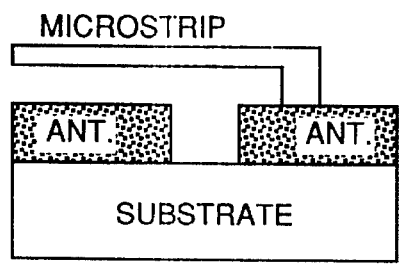

FIGS. 3 and 4 respectively present a plan view and a side view of the thin film antenna element of FIGS. 1 and 2. The specific thin film antenna illustrated in FIG. 3 is a log-periodic antenna. The antenna 3 consists of a geometrically expanded series of "teeth" offset by 45 degrees. The smallest tooth is 43 microns from the vertex. The antenna extends to a 3,000 micron radius form the vertex. Coupling is via a microstrip structure originating at the antenna vertex.

The antenna displays a number of favorable attributes for receiver applications. It is wideband, has a well-defined impedance, and has a reasonably good antenna pattern. The logarithmic nature of the antenna minimizes resonances associated with fixed length scales. The antenna is designed for multi-octave operation, far wider than the bandwidths of succeeding components in the receiver architecture. Because the antenna is complementary, i.e., it is its own inverse, the impedance on a silicon substrate should be purely real and approximately 75 ohms.

The THz frequency band allows, and indeed requires, the use of specialized antenna structures significantly different from those of lower microwave frequencies. In particular, the thin film antenna geometry is attractive for broadband coupling at high frequencies.

The antenna serves as the gateway for free space electromagnetic signals to enter the receiver. The requirements for the antenna are defined by those of the terahertz receiver system. The antenna must efficiently couple external signals into our circuitry. In addition, the antenna system must overcome the impedance mismatch between the 377 ohm impedance of free space and the 1 to 2 ohm levels of the superconducting circuits. This is accomplished using an impedance-matching, resonant transformer. In FIGS. 2–6 the thin film antenna metallization is niobium, but other superconductors and other high conductivity metals (silver, copper, niobium nitride, aluminum, gold, etc.) can be used. The antenna height and width dimensions are derived from the anticipated wavelength and frequency of the signals that the antenna will receive. It is common for these dimensions to be approximately one quarter of the signal wavelength to maximize signal reception.

In the antennas of FIGS. 3 and 4, the dielectric plays a major role in determining beamshape. For even moderate dielectric constants, the received pattern is pulled into the substrate, with only minor coupling directly to free space. The antenna of FIGS. 3 and 4 has a special antenna shorting element. The log-periodic antenna concentrates electric fields at its vertex. In order to couple the energy out into microstrip, we electrically connect the top electrode of the microstrip to the "hot" side of the antenna. Two methods are discussed. FIG. 3 shows a direct connection technique, in which the microstrip directly contacts the opposing vertex of the antenna. The left antenna metallization serves as the groundplane for the microstrip. This method has one practical drawback: it passes low frequencies into the circuit, including static discharges and low frequency jamming.

The antenna of FIGS. 3 and 4 has a direct connection microstrip coupling to the log-periodic antenna vertex. The central part of the antenna is shown, along with the microstrip leading off the left.

Figure 5:
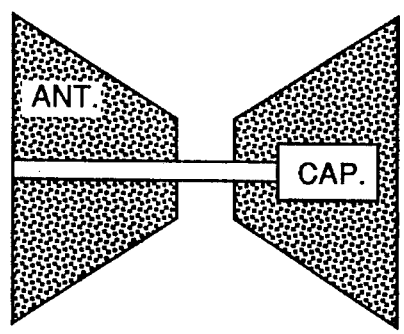
Figure 6:
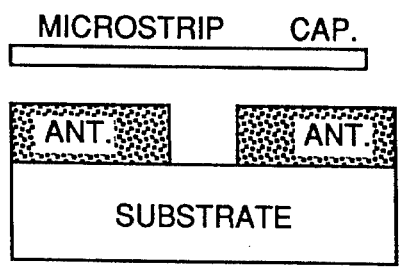

To reject low frequencies, we developed a capacitive coupler, shown in FIGS. 5 and 6. No dc contact is made at the antenna vertex. Because capacitors which are small compared to the dielectric wavelength are impractical below millimeter wavelengths, we chose a distributed, shaped capacitor geometry. By choosing two tapered trapezoids, we achieved low effective impedance at both 100 GHz and 200 GHz. As an added benefit, the design partially rejects radiation in the intervening frequency bands, as well as dc.

FIGS. 5 and 6 respectively, depict a top view and a side view of the antenna, showing the capacitive connection microstrip coupling to the log-periodic antenna vertex. By using a capacitive connection to the right-side antenna area, low frequency noise and interference are rejected. In actual circuits, the capacitor can be trapezoidally shaped to couple well to 100 and 200 GHz radiation.

The inherent impedance mismatch between free space impedance (377 ohms) and superconducting microstrip and Josephson device impedance (1–2 ohms) presented a challenge for antenna system design. Even with the silicon-based antenna structure, which reduced the feed impedance to under 100 ohms, a matching structure is required. A quarter-wave transmission line transformer can match the devices at the signal frequency. This design will work adequately over a signal bandwidth of a few gigahertz.

Returning to FIG. 1, note that RF signals received by the antenna 100 are amplified by the preamplifier 110, before they are frequency down converted by the mixer 120 into IF signals for the IF amplifier 130. Both the preamplifier 110 and IF amplifier 130 follow the parametric amplifier design described by A. Smith et al in the article entitled "Low Noise Microwave Amplifier" which was published in IEEE in 1985, the disclosure of which is incorporated herein by reference.

Figure 7:
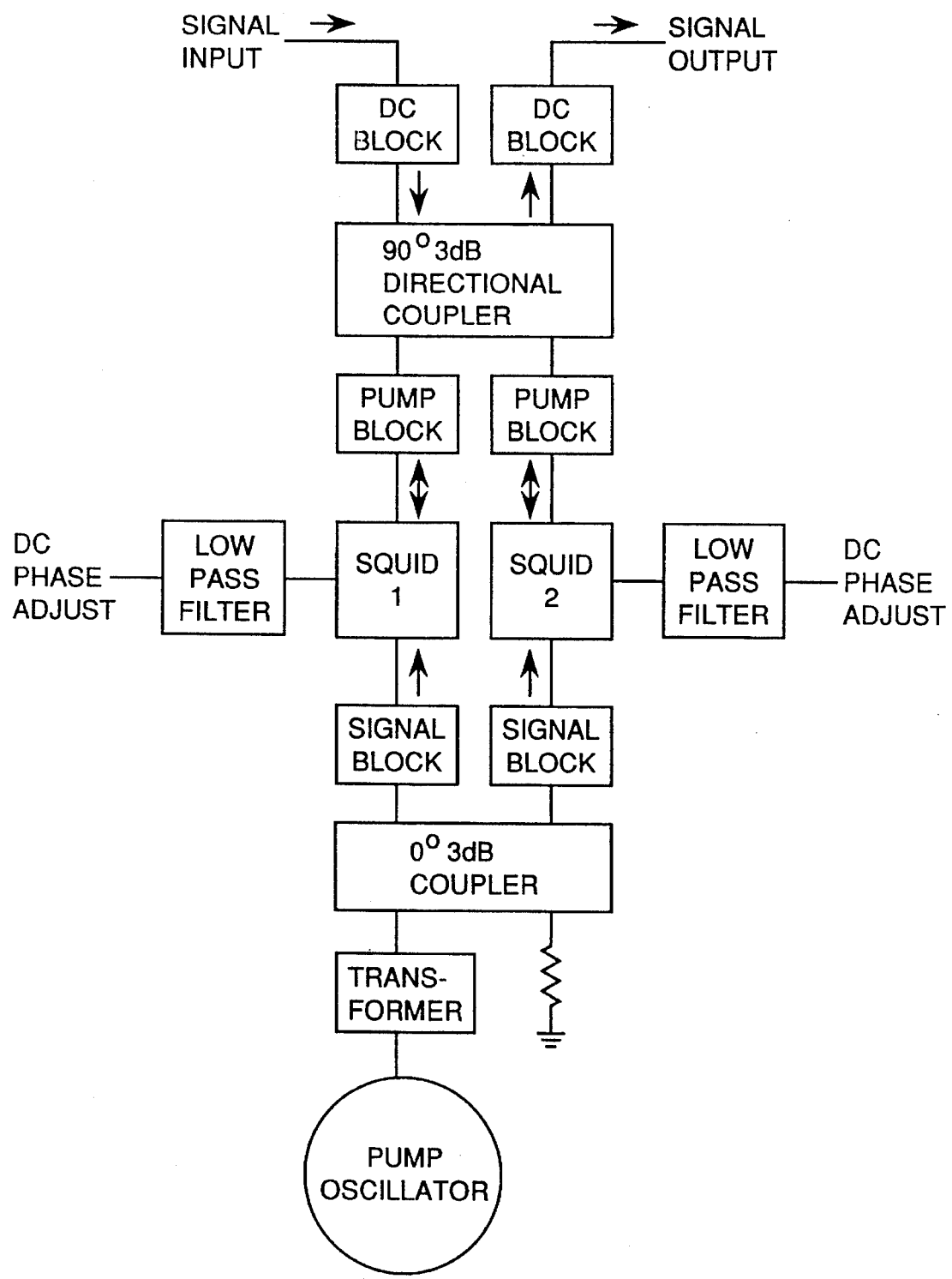
FIG. 7 is a block diagram of the parametric amplifier used in the system of FIG. 1.

A block diagram of the amplifier design is shown in FIG. 7. Input signal enters the amplifier through a dc block used to reject external bias levels. The signal is split equally into two channels using a 90 degree, branchline, directional coupler. Each half of the signal is presented to a pumped RF SQUID which acts as a reflection amplifier. The reflected, amplified signal propagates back through the 90 degree coupler. The phase relationships of the directional coupler cause the output signal to exit the amplifier on the port opposite the input port.

Components for the parametric amplifier have been reported (see A. Smith, et al., cited above). Others, such as 90° branchline couplers are direct extensions of microwave integrated circuits to superconducting thin film circuits.

The pump oscillator can be based on single junction SQUID designs reprinted by A. Smith, et al. (and array designs of Lukens and collaborators). An additional requirement is that the pump ports do not disturb the signal flow and disrupt the input/output isolation.

Standard branchline coupler designs are readily implemented in superconducting microstrip and should provide the required phasematch to the two pump channels. Port-to-port isolation throughout the amplifier is executed with high Q, microstrip-based filter designs.

Figure 8:
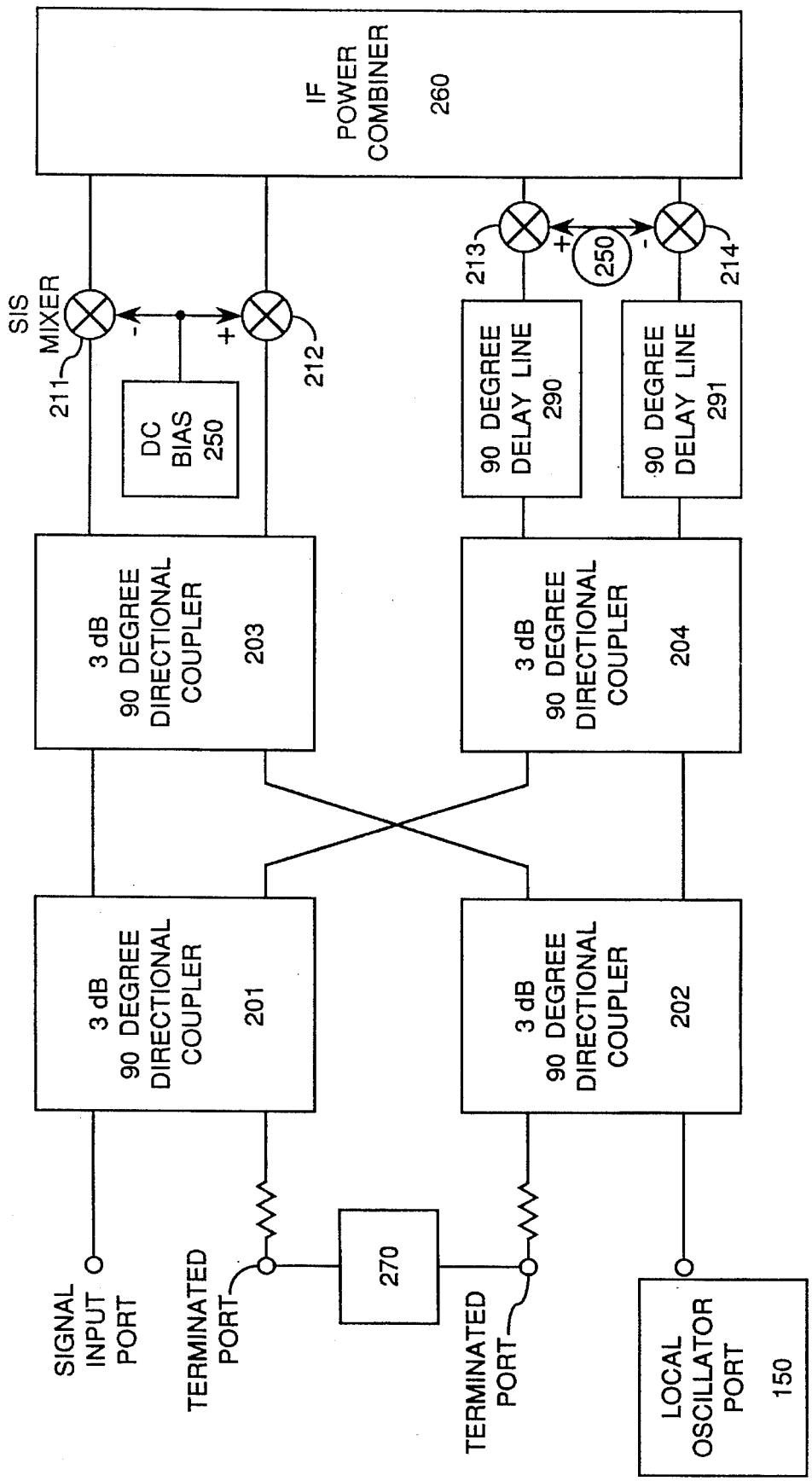
FIG. 8 is an illustration of the mixer system that is used in the system of FIG. 1.

Returning to FIG. 1, note that amplified RF signals from the preamplifier 110 are frequency downconverted by the mixer 120 into IF signals for the IF amplifier 130. The principles of frequency downconversion as discussed in the cited references, and in the "Radar Handbook" by M. Skolnik, the disclosure of which is incorporated herein by reference. FIG. 8 is the double balanced superconducting mixer network of the present invention, which serves as the mixer element 120 in the diagram of FIG. 1.

The superconductive mixer network of FIG. 8 performs frequency downconversion of signals using: four 90 degree hybrid couplers 201–204, four SIS mixers 211–214, a local oscillator 150, a DC bias polarity source 250, a 90 degree delay line 290, an IF power combiner 260, and termination loads 270.

Each of the 90 degree hybrid couplers serves to split received inputs equally over a pair of output ports. The first hybrid coupler 201 receives the RF signals from the antenna 100 and preamplifier 110 of FIG. 1, and splits them to provide inputs to the third and fourth hybrid couplers 203 and 204.

The second hybrid coupler 202 splits the local oscillator signal from the local oscillator 150, and provides split-local oscillator signals to the third and fourth hybrid couplers 203 and 204.

The third hybrid coupler 203 has two output ports that are connected by in-phase lines to the first and second SIS mixers 211 and 212. Each of the two mixers 211 and 212 receives a combined signal that contains the split RF signal (from the first hybrid coupler 201) and the split local oscillator signal (from the second hybrid coupler 202). The fourth hybrid coupler 204 outputs the same type of signals as the third hybrid coupler 203, but they are delayed by a 90 degree delay line to produce quadrature combined signals for the third and fourth mixers 213 and 214.

The termination loads 270 are connected to the first and second hybrid couplers 201 and 202 in order to receive and terminate reflected signals therefrom. Note that the termination loads do not output any signals to the hybrid couplers 201 and 202, but serve only as a means for eliminating reflections received by these couplers from the third and fourth hybrid couplers 203 and 204. A variety of elements exist that can serve as termination loads, such as a lossy line, or a matching load which connects an input port with the first two hybrid couplers 201 and 202 of the ground plane.

Each of the SIS mixers 211–214 receives inputs from the third and fourth hybrid couplers 203 and 204 and the DC bias polarity source 250 to output thereby a downconverted IF signal that represents the signal characteristics of the RF signal received by the antenna 100 of FIG. 1. Also, the relative phase of the signal and local oscillator is preserved as shown in FIG. 8. By selecting the appropriate polarities of the dc junction biases, the detected intermediate frequency outputs of the SIS detectors add coherently. The quadrature-fed mixer scheme ensures maximum conversion efficiency.

Both isolation and return losses are high for the quadrature-fed method. Significant reflections from the SIS mixers are anticipated. The 90 degree coupler network acts to cancel reflections which would otherwise propagate to the input ports. Reflected power is dumped into the terminations, squelching potential feedback problems.

As mentioned above, the challenge of the present invention is the integration of antenna, amplifier, mixer, and oscillator circuits while maintaining high performance from each subcircuit. The superconducting circuit blocks are well suited for millimeter and sub-millimeter wave circuits. Successful operation of an integrated receiver also requires low loss matching between circuit blocks while efficiently blocking interference signals, such as local oscillator of pump power between stages.

As mentioned above, both the 10 GHz and 100 GHz amplifiers have the same design, and are fabricated on the same wafer. The IF amplifier 130 amplifies the downconverted IF signals produced by the mixer circuit 120 of FIG. 1. One suitable mixer is the subject of a related patent application Ser. No. 08/272,916 filed Jul. 11, 1994 by the present inventor and entitled "Doubly Balanced Superconductive Mixer Network" the disclosure of which is incorporated herein by reference.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A superconductive heterodyne receiver which receives and downconverts terahertz radio frequency signals into amplified intermediate frequency signals, said superconductive heterodyne receiver comprising:

an antenna which receives said terahertz radio frequency signals from free space;

a means for amplifying said terahertz radio frequency signals from said antenna to produce thereby a set of amplified radio frequency signals;

a local oscillator, which produces local oscillator signals;

a superconductive mixer network which receives and mixes said local oscillator signals from said local oscillator with said set of amplified radio frequency signals from said amplifying means to produce thereby a set of intermediate radio frequency signals, wherein said superconductive mixer network comprises:

(1) a mixer circuit which mixes said local oscillator signals with said radio terahertz frequency signals to produce thereby intermediate frequency signals, said mixer network producing reflected signals as a side effect of processing said oscillator signals and said radio frequency signals, wherein said mixer network comprises:

(1a) first, second, third and fourth coupler elements, each having first and second input terminals and first and second output terminals, said first coupler element receiving said radio frequency signals over its first input terminal and splitting the radio frequency signals to output them over its first and second output terminals;

(1b) said second coupler element receiving said local oscillator signals over its first and second input terminal and splitting the local oscillator signals to output them over its first and second output terminals to said third and fourth coupler elements;

(1c) said third and fourth coupler elements each having their first and second input terminals respectively connected to the first and second output terminals of the first and second coupler elements to receive said radio frequency signals and said local oscillator signals therefrom, said third and fourth coupler elements outputting sets of coupled signals over their first and second output terminals; and (1d) a means for mixing the sets of coupled signals from the third and fourth coupler elements to output thereby said sets of intermediate frequency signals to said intermediate frequency power combiner;

2) an intermediate frequency power combiner which combines said intermediate frequency signals from said mixer circuit to output thereby said set of intermediate frequency signals; and (3) a means for draining said reflected signals from said mixer network so that said reflected signals do not contaminate the local oscillator signals from said local oscillator; and an intermediate frequency amplifier which receives and amplifies said set of intermediate frequency radio signals from said superconductive mixer network to produce thereby said amplified intermediate frequency signals.

2. A superconductive mixer network, as defined in claim 1, wherein said draining means comprises a terminating load which is electrically connected to the second input terminals of said first and second coupler elements to eliminate said reflected signals therefrom.

3. A superconductive mixer network, as defined in claim 1, wherein said mixing means comprises:

first and second mixer elements which are respectively connected to the first and second output terminals of said third coupler element, to receive and mix said local oscillator signals with said terahertz radio frequency signals, and producing said sets of intermediate frequency signals thereby;

third and fourth mixer elements which are respectively connected to the first and second output terminals of said fourth coupler element, to receive and mix said local oscillator signals with said terahertz radio frequency signals and producing said sets of intermediate frequency signals thereby; and a means for providing a D.C. bias current to said first, second, third and fourth mixer elements.

4. A superconductive mixer network, as defined in claim 3, further comprising a first and second ninety degree delay line which respectively connect said third and fourth mixer elements to the first and second output terminals of the said fourth coupler element.

5. A superconductive mixer network, as defined in claim 1, wherein said first, second, third and fourth coupler elements each comprise a 3 dB ninety degree directional coupler.

\* \* \* \* \*